United States Patent
Straßer

(10) Patent No.: US 10,438,869 B2
(45) Date of Patent: Oct. 8, 2019

(54) POWER SEMICONDUCTOR MODULE FOR A MOTOR VEHICLE AND MOTOR VEHICLE

(71) Applicant: AUDI AG, Ingolstadt (DE)

(72) Inventor: Roman Straßer, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/933,836

(22) Filed: Mar. 23, 2018

(65) Prior Publication Data
US 2018/0331017 A1  Nov. 15, 2018

(30) Foreign Application Priority Data

May 11, 2017 (DE) .................. 10 2017 207 962

(51) Int. Cl.
| | | |
|---|---|---|
| *H01L 23/473* | (2006.01) | |
| *H01L 23/373* | (2006.01) | |
| *H01L 23/44* | (2006.01) | |
| *H01L 25/18* | (2006.01) | |
| *H05K 7/20* | (2006.01) | |

(Continued)

(52) U.S. Cl.
CPC .......... *H01L 23/473* (2013.01); *B60L 15/007* (2013.01); *H01L 23/373* (2013.01); *H01L 23/44* (2013.01); *H01L 25/18* (2013.01); *H05K 7/20927* (2013.01); *H05K 7/20936* (2013.01); *B60L 50/50* (2019.02); *B60L 58/20* (2019.02); *H01L 25/072* (2013.01); *H01L 2924/13055* (2013.01); *H01L 2924/13091* (2013.01);

(Continued)

(58) Field of Classification Search
CPC ..... H01L 23/473; H01L 23/373; H01L 23/44; H01L 25/18; H01L 25/072; H01L 2924/13055; H01L 2924/13091; H01L 23/34–4735; H01L 31/024; H01L 31/052–0525; H01L 33/64–648; H01L 21/4871–4882; B60L 15/007; B60L 50/50; B60L 58/20; H05K 7/20927; H05K 7/20936; H01M 10/625; H01M 10/6567; H01M 2220/20
See application file for complete search history.

(56) References Cited

U.S. PATENT DOCUMENTS

| | | |
|---|---|---|
| 5,448,108 A | 9/1995 | Quon et al. |
| 2004/0164432 A1 | 8/2004 | Hsu et al. |

(Continued)

FOREIGN PATENT DOCUMENTS

| | | |
|---|---|---|
| DE | 4220305 A1 | 1/1993 |
| DE | 102008026550 A1 | 12/2008 |

(Continued)

OTHER PUBLICATIONS

Search Report dated Oct. 9, 2018 in corresponding European Application No. 18160074.3; 13 pages with partial machine generated English-language translation.

(Continued)

*Primary Examiner* — Shahed Ahmed
(74) *Attorney, Agent, or Firm* — Maier & Maier, PLLC

(57) ABSTRACT

A power semiconductor module for a motor vehicle. a plurality of unhoused power semiconductor chips are provided, which are arranged so that a liquid coolant that is introduced into the power semiconductor module through a liquid coolant feed line can circulate directly around them.

7 Claims, 2 Drawing Sheets

(51) Int. Cl.
  *B60L 15/00*     (2006.01)
  *H01M 10/625*    (2014.01)
  *H01M 10/6567*   (2014.01)
  *H01L 25/07*     (2006.01)
  *B60L 50/50*     (2019.01)
  *B60L 58/20*     (2019.01)

(52) U.S. Cl.
  CPC ...... *H01M 10/625* (2015.04); *H01M 10/6567* (2015.04); *H01M 2220/20* (2013.01)

(56) References Cited

U.S. PATENT DOCUMENTS

| | | | | |
|---|---|---|---|---|
| 2008/0055852 | A1* | 3/2008 | Uluc | H05K 7/20681 |
| | | | | 361/696 |
| 2008/0101013 | A1* | 5/2008 | Nelson | H01L 23/4735 |
| | | | | 361/689 |
| 2013/0313712 | A1* | 11/2013 | Otremba | H01L 24/37 |
| | | | | 257/773 |
| 2019/0047372 | A1* | 2/2019 | Schroeder | G01K 7/427 |

FOREIGN PATENT DOCUMENTS

| | | |
|---|---|---|
| JP | 2008-041806 A | 2/2008 |
| KR | 20150063860 A | 6/2015 |

OTHER PUBLICATIONS

Examination Report dated Dec. 15, 2017 of corresponding German application No. 102017207962.2; 10 pgs.

* cited by examiner

POWER SEMICONDUCTOR MODULE FOR A MOTOR VEHICLE AND MOTOR VEHICLE

FIELD

The invention relates to a power semiconductor module for a motor vehicle and a motor vehicle.

BACKGROUND

Power semiconductor modules in motor vehicles typically have a plurality of power semiconductor chips and are used as switching units for current converters, such as rectifiers or pulsewidth-modulated inverters. In partially or completely electrically driven motor vehicles, a power semiconductor module can be used, for example, for producing a multiphase alternating current from the output voltage of a high-voltage battery or for converting an alternating current to a charging direct current for a high-voltage battery. Power semiconductor chips heat up substantially thereby and have to be cooled in order to prevent any damage.

It is known to arrange the power semiconductor chips on a cooling element, which is designed, for example, as a solid metal block, in particular one made of aluminum, and has, for example, bored, cast, or milled cooling channels. A liquid coolant circulates through the cooling channels, which dissipate the heat from the liquid coolant because of the thermal coupling of the cooling element to the power semiconductor chips. In order to prevent any contact of the liquid coolant with the power semiconductor chips, high requirements are placed on the leaktightness of liquid coolant feed lines to the cooling element. In this case, the use of special seals for the liquid coolant feed lines and the use of electrically insulating liquid coolants, such as insulating oil are especially costly. The thermal coupling of the power semiconductor chips to the cooling element occurs, in addition, only via a long heat transfer path from the power semiconductor chips by way of a support plate, which, for example, is made of plastic, a ceramic substrate, or another support material, for example, a ceramic substrate, and a thermally conducting pad or a thermally conducting paste, thereby detrimentally inhibiting the heat transfer.

SUMMARY

The invention is therefore based on the object of presenting a power semiconductor module, which is efficient and can be cooled at low cost, for a motor vehicle.

In order to achieve this object, it is provided in accordance with the invention that, for a power semiconductor module of the kind mentioned in the introduction, a plurality of unhoused power semiconductor chips are provided, which are arranged such that a liquid coolant, which is introduced into the power semiconductor module through a liquid coolant feed line, can circulate directly around them.

The invention is based on the idea of allowing the appropriately electrically insulating liquid coolant to circulate directly around the power semiconductor chips and thereby to bring about a direct cooling. The power semiconductor chips are formed unhoused in accordance with the invention—for example, as bare dies—so that an additional heat transfer path through a chip housing, which inhibits the heat transfer to the liquid coolant, is dispensed with. It is likewise possible through the direct cooling of the power semiconductor chips to dispense with a cooling element with costly seals and heat transfer means, such as thermally conducting pads or thermally conducting pastes.

The power semiconductor module according to the invention can be fabricated advantageously at lower cost, because a chip housing, a cooling element, and associated seals can be dispensed with. At the same time, an especially efficient cooling of the power semiconductor chips is made possible directly at the chip surface thereof without additional heat transfer paths between the chip surface and the liquid coolant.

Preferably, the power semiconductor chips form power transistors. For example, isolated gate bipolar transistors (IGBT) or isolated gate field effect transistors, such as power MOSFETs are involved here. In this case, a power conductor chip can create a single transistor or a circuit containing a plurality of single transistors. Alternatively or additionally, the power semiconductor chips can form flyback diodes, which are preferably associated with the power transistors in order to cool the latter analogously.

In regard to the use of the semiconductor module as a current converter in a motor vehicle, when the power semiconductor chips are connected, it is preferred to form a bridge circuit, in particular a half bridge or a B6 bridge. For this purpose, the power semiconductor module can have a control circuit or a control input for control signals of an external control device for actuation of the power semiconductor chip.

Provided in the power semiconductor module according to the invention is appropriately a support element, on which the power semiconductor chips are arranged. It is preferred in this case, if the support element is arranged such that liquid coolant can circulate on its side having the power semiconductor chips or on both sides within the power semiconductor module. It is thus also possible advantageously for the circulating liquid coolant to dissipate the heat delivered to the support element.

In accordance with a first embodiment variant, the support element has a cooling element with at least one cooling channel through which the liquid coolant can circulate. Therefore, it is also possible nonetheless to use a conventional cooling element for the direct cooling in accordance with the invention, in order to allow an additional dissipation of heat on the side of the power semiconductor chip that is not in direct contact with the liquid coolant. The cooling channels can be formed in the cooling element by boring, casting, or milling. Said cooling element is, for example, a metal block, preferably made of aluminum. The support element that comprises a cooling element can additionally comprise a support plate, on which the power semiconductor chips are fastened. The cooling channel can be in flow connection with the or a coolant feed line and/or with the or a liquid coolant drainage line, in order to convey the liquid coolant from the outer surroundings of the housing into the cooling channels or from the cooling channels to the outer surroundings of the housing.

Another embodiment variant provides that the support element is a support plate. This means that no cooling element that is mechanically connected to the power semiconductor chips is provided. In this embodiment variant, the heat transfer from the power semiconductor chips to the liquid coolant thus occurs exclusively directly through the contact of the liquid coolant with the power semiconductor chips and, under certain circumstances, through the contact of the liquid coolant with the support plate.

In both embodiment variants, the support plate can be formed from a ceramic substrate or from another suitable support material. The support plate can also be a circuit board made of a plastic. The support plate can further have strip conductors. The strip conductors can be connected in an electrically conductive manner to the power semiconductor chips through contacting wires. The support plate can also have contact elements for external electrical contacting of the power semiconductor chips.

Preferably provided also in the power semiconductor module according to the invention is a housing that accommodates the power semiconductor chips and at which the liquid coolant feed line is formed. The housing is preferably fluid-tight in construction. It can also have a liquid coolant drainage line. Via the liquid coolant feed line and the liquid coolant drainage line, the power semiconductor module is connected to or can be connected to a cooling apparatus, which is preferably on the motor vehicle side, for the formation of a closed cooling circuit.

The housing can additionally have a first housing portion, at which the liquid coolant feed line and/or the liquid coolant drainage line is/are provided, and a second housing portion, which is formed separately from the first housing portion in a fluid-tight manner. The liquid coolant thus does not circulate through the second housing portion. The second housing portion, for example, cannot accommodate components that are to be cooled by the liquid, such as, for example, the control circuit.

The object on which the invention is based is further achieved in accordance with the invention by a motor vehicle, which comprises at least one battery and at least one current converter, which is connected to the battery and has a power semiconductor module according to the invention. Preferably, as a battery, a high-voltage battery for an electric drive of the motor vehicle and/or a low-voltage battery for supplying an onboard power supply system, in particular with a rated voltage of 48 volts, is/are provided. A high-voltage battery is understood to mean a battery with a rated voltage of at least 60 volts, preferably at least 100 volts. A low-voltage battery is a battery with a rated voltage of less than 60 volts—for example, 12 volts, 24 volts, or 48 volts.

All statements in regard to the power semiconductor module according to the invention can be analogously extended to the motor vehicle according to the invention, so that the aforementioned advantages can also be realized with said motor vehicle.

BRIEF DESCRIPTION OF THE DRAWINGS

Further advantages and details of the invention ensue from the exemplary embodiments described below as well as on the basis of the drawings. These are schematic illustrations and show.

DETAILED DESCRIPTION OF THE DRAWINGS

Figure 1:
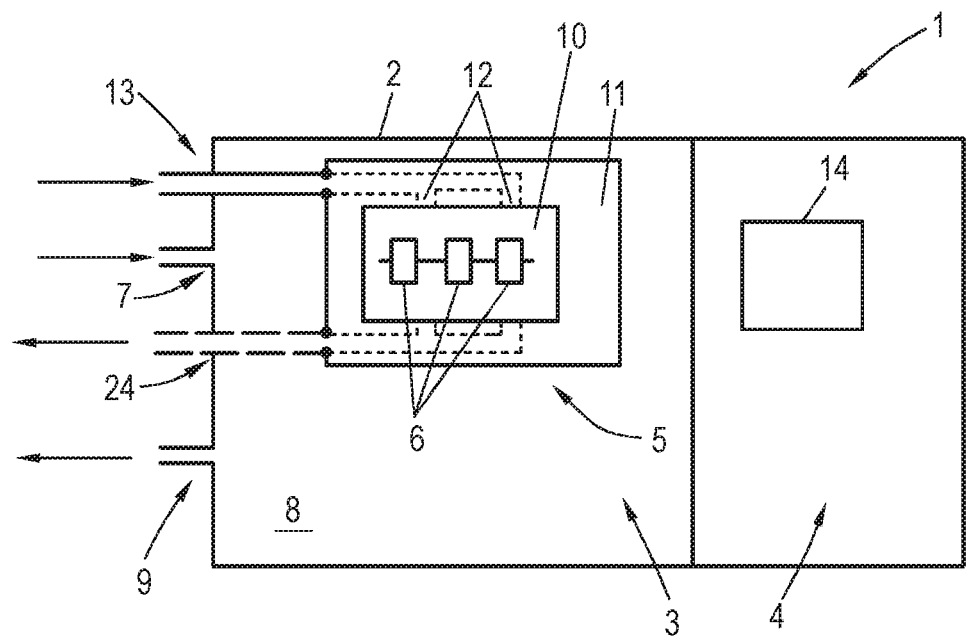
FIG. 1 a schematic drawing of a first exemplary embodiment of a power semiconductor module according to the invention.

FIG. 1 shows a schematic drawing of a first exemplary embodiment of a power semiconductor module 1, which comprises a housing 2 with a first housing portion 3 and a second housing portion 4.

Formed in the first housing portion 3 are a plurality of unhoused power semiconductor chips 6, which are arranged on a support element 5 as IGBTs or power MOSFETs, which are constructed, for example, as bare dies with associated flyback diodes. The power semiconductor chips 6 are illustrated purely schematically and are connected to form a bridge circuit, such as, for example, a half bridge or a B6 bridge. The first housing portion 3 further has a liquid coolant feed line 7, by means of which the fluid-tight encapsulated interior of the first housing portion 3 is flooded with an electrically insulating liquid coolant 8. The liquid coolant 8 thus circulates around the unhoused power semiconductor chips 6 directly and dissipates the heat produced by them during operation. Provided for drainage of the liquid coolant is a liquid coolant drainage line 9, to which an external cooling apparatus can be connected for creation of a closed cooling circuit with the liquid coolant feed line 7.

The support element 5 comprises a support plate 10, which is formed as a ceramic substrate, for example, and on which the power semiconductor chips 6 are fastened and can be contacted externally, and a cooling element 11, on which the support plate 10 is arranged. The support plate 10 is coupled thermally—for example, through a heat transfer means, such as a thermally conducting pad or a thermally conducting paste—to the cooling element 11 that has a plurality of cooling channels 12 in its interior.

The liquid coolant 8 also circulates in the cooling channels 12, for which purpose the housing has another liquid coolant feed line 13. Alternatively or additionally to the additional liquid coolant feed line 13, another liquid coolant drainage line 24, shown as a dashed line, is provided. The liquid coolant feed lines 7 and 13 can also be formed as a common liquid coolant feed line. Accordingly, the liquid coolant drainage lines 9 and 24 can also be formed as a common liquid coolant drainage line. It is also possible to dispense with the additional liquid coolant feed line 13 and the additional liquid coolant drainage line 24. In this case, the liquid coolant 8 can circulate through the liquid coolant feed line 7 into the housing 2 and, from there, also through the cooling channels 12 and then flow through the liquid coolant drainage line 9 out of the housing 2.

The second housing portion 4 is separated in a fluid-tight manner from the first housing portion 3 and accommodates a control circuit 14, which is formed for actuation of the power semiconductor chips 6 and is connected to it in an electrically conductive manner. Because the control circuit 14 produces less waste heat than the power semiconductor chips 6, it is possible in this case to dispense with a direct cooling by way of the liquid coolant 8. It is also possible overall to dispense with the second housing portion 4 when the control circuit 14 is likewise arranged in the first housing portion 3 or when an external control device is used.

Figure 2:
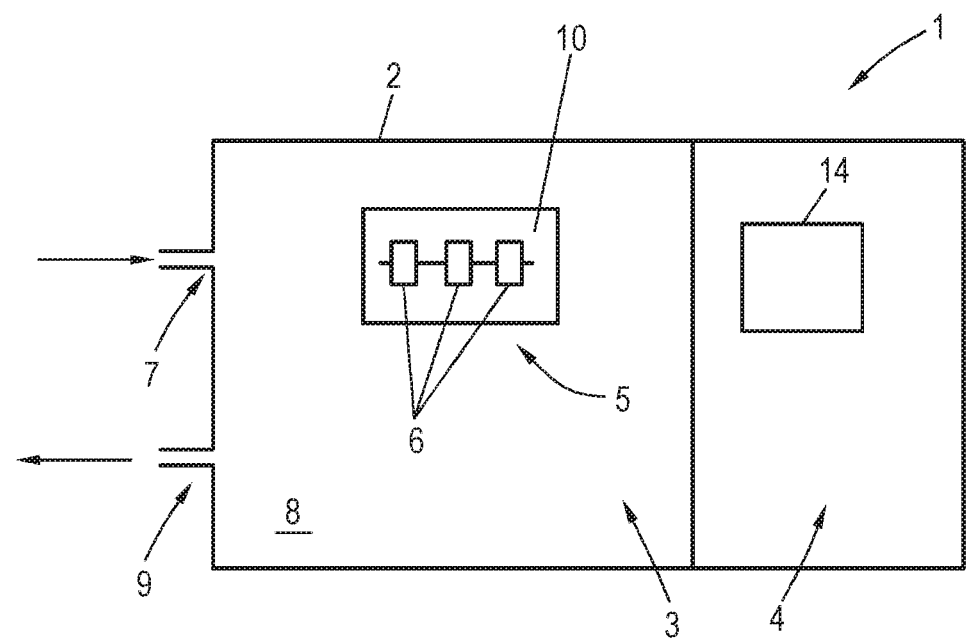
FIG. 2 a schematic drawing of another exemplary embodiment of a power semiconductor module according to the invention.

FIG. 2 shows another exemplary embodiment of a power semiconductor module 1, which corresponds to the one shown in FIG. 1 and differs from it in that the support element 5 is formed solely by the support plate 10. An additional cooling element is thus dispensed with. In this case, the liquid coolant 8 circulates around the support plate 10 both on the side bearing the power semiconductor chips 6 and on the back side.

Figure 3:
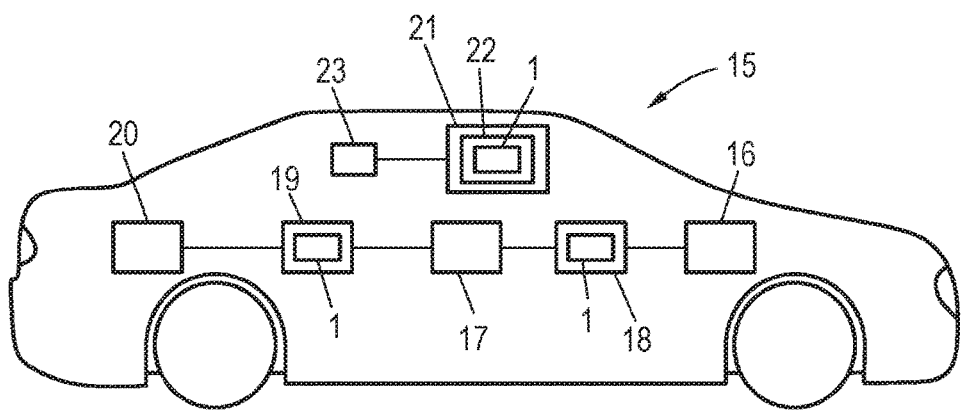
FIG. 3 a schematic drawing of a motor vehicle according to the invention.

FIG. 3 shows a schematic drawing of an exemplary embodiment of a motor vehicle 15, which comprises an electric motor 16 for full or partial drive of the motor vehicle 15 and a high-voltage battery 17 with a rated voltage of at least 60 volts. The high-voltage battery 17 and the electric motor 16 are connected through a current converter 18 in the form of a pulsewidth-modulated inverter, which has a power semiconductor module 1 in accordance with one of the aforementioned initial examples. The battery 17 is further connected via an additional current converter 19, which also has at least one power semiconductor module 1 and is part of a charging apparatus, to a charging terminal 20 of the motor vehicle 15. Another current converter 21 with at least one power semiconductor module 1 is part of an onboard power supply system 22 with a rated voltage of, for example, 48 volts, which is fed by a corresponding low-voltage battery 23.

The invention claimed is:

1. A power semiconductor module for a motor vehicle, comprising:
    a plurality of unhoused power semiconductor chips are provided, which are arranged so that a liquid coolant that is introduced into the power semiconductor module through a liquid coolant feed line can circulate directly around them, wherein a support element is provided, on which the power semiconductor chips are arranged, wherein the support element has a cooling element with at least one cooling channel through which the liquid coolant can circulate,
    wherein a housing that accommodates the power semiconductor chips is provided, at which the liquid coolant feed line is formed, the housing includes a first housing portion and a second housing portion, and the second housing portion is isolated from the liquid coolant.

2. The power semiconductor module according to claim 1, wherein the power semiconductor chips form power transistors, in particular, isolated gate bipolar transistors or isolated gate field effect transistors, and/or flyback diodes.

3. The power semiconductor module according to claim 1, wherein the power semiconductor chips are connected to form a bridge circuit, in particular a half bridge or a B6 bridge.

4. The power semiconductor module according to claim 1, wherein the support element is arranged so that liquid coolant can circulate around it on its side with the power semiconductor chips or on both sides within the power semiconductor module.

5. The power semiconductor module according to claim 1, wherein the support element is a support plate.

6. A motor vehicle comprising at least one battery and at least one current converter, which has a power semiconductor module according to claim 1, and is connected to the battery.

7. The motor vehicle according to claim 6, wherein, as a battery, a high-voltage battery for an electric drive of the motor vehicle and/or a low-voltage battery for supply of a onboard power supply system, in particular with a rated voltage of 48 volts, is/are provided.

* * * * *